(12) United States Patent
Khapochkin et al.

(10) Patent No.: US 7,999,562 B2
(45) Date of Patent: Aug. 16, 2011

(54) APPARATUS AND METHOD OF CAPACITIVELY SENSING OPERATOR PRESENCE FOR A STUMP CUTTER

(75) Inventors: Yuriy Khapochkin, Pella, IA (US); Hans Kelpe, Pella, IA (US)

(73) Assignee: Vermeer Manufacturing Company, Pella, IA (US)

( * ) Notice: Subject to any disclaimer, the term of this patent is extended or adjusted under 35 U.S.C. 154(b) by 347 days.

(21) Appl. No.: 12/182,057

(22) Filed: Jul. 29, 2008

(65) Prior Publication Data
US 2009/0079444 A1 Mar. 26, 2009

Related U.S. Application Data

(60) Provisional application No. 60/962,818, filed on Jul. 31, 2007.

(51) Int. Cl.
*G01R 27/26* (2006.01)
(52) U.S. Cl. ........................ 324/688; 324/686
(58) Field of Classification Search .................. 324/688, 324/686
See application file for complete search history.

(56) References Cited

U.S. PATENT DOCUMENTS

| | | | |
|---|---|---|---|
| 5,746,261 A | 5/1998 | Bowling | |
| 5,801,340 A * | 9/1998 | Peter | 178/20.04 |
| 5,847,690 A * | 12/1998 | Boie et al. | 345/104 |
| 6,014,996 A | 1/2000 | Egging et al. | |
| 6,026,871 A | 2/2000 | Chapman | |
| 6,501,281 B1 * | 12/2002 | Rundo | 324/658 |
| 6,590,171 B1 * | 7/2003 | Wolf et al. | 200/51 LM |
| 7,154,393 B2 * | 12/2006 | Okushima et al. | 340/562 |
| 7,795,882 B2 * | 9/2010 | Kirchner et al. | 324/686 |

FOREIGN PATENT DOCUMENTS

| | | |
|---|---|---|
| EP | 0 977 363 A2 | 2/2000 |
| EP | 1 712 418 A2 | 10/2006 |
| GB | 2 005 422 A | 4/1979 |
| WO | WO 89/08352 | 9/1989 |

OTHER PUBLICATIONS

International Search Report and Written Opinion mailed Nov. 20, 2008 from International Application No. PCT/US2008/071608.
International Search Report and Written Opinion mailed Nov. 20, 2008 from International Application No. PCT/US2008/071628.
SC60TX Stump Cutter Operator's Manual, SC60TX_01_03, Order No. 105400V64, 92 pages, ©2004, Vermeer Manufacturing Company.
SC60TX Stump Cutter Operator's Manual, SC60TX_02_03, Order No. 105400Y38, 86 pages, ©2008, Vermeer Manufacturing Company.

(Continued)

*Primary Examiner* — Jeff Natalini
(74) *Attorney, Agent, or Firm* — Merchant & Gould P.C.

(57) ABSTRACT

An operator detection and presence device includes a conductive sensor and a guard electrode. The sensor and electrode are physically located and electrically connected in a manner which helps the detection circuit measure if an operator's hand is on the handle or if the change in capacitance is due to water. The sensor and electrode are preferably physically located in the handle spaced apart from one another, where the sensor is located in an area that the operator will touch. The electrode is located in an area that the operator will not generally touch. A detection circuit is connected to the sensor and electrode for measuring whether the capacitance of the sensor has changed. The electrode is used to avoid false detections and/or the ability to detect of operator presence.

11 Claims, 4 Drawing Sheets

OTHER PUBLICATIONS

SC60TX Stump Cutter Maintenance Manual, SC60TX_m1_01, Order No. 105400V66, 71 pages, ©2003, Vermeer Manufacturing Company.

SC60TX Stump Cutter Maintenance Manual, SC60TX_m2_03, Order No. 105400Y40, 82 pages, ©2006, 2007, Vermeer Manufacturing Company.

SC60TX Stump Cutter Parts Manual, SC60TX_P1_03, Order No. 105400ZDG, 155 pages, ©2004, Vermeer Manufacturing Company.

SC60TX Stump Cutter Parts Manual, SC60TX_P2.07, Order No. 105400ZHF, 138 pages, ©2006-2008, Vermeer Manufacturing Company.

* cited by examiner

Handle embodiments

APPARATUS AND METHOD OF CAPACITIVELY SENSING OPERATOR PRESENCE FOR A STUMP CUTTER

CROSS REFERENCES TO RELATED APPLICATIONS

This application claims the benefit of U.S. Provisional Application No. 60/962,818, filed Jul. 31, 2007, the disclosure of which is hereby incorporated by reference.

FIELD OF THE INVENTION

The present invention relates generally to stump cutters; more specifically to an apparatus and method for capacitively sensing/detecting the presence of an operator of a stump cutter; and more specifically still to utilizing two capacitive devices in connection with each of the hydraulic control handles of a stump cutter in order to more reliably determine the presence of an operator.

BACKGROUND OF THE INVENTION

Stump cutting machines are well known for removing undesirable tree stumps. Such machines include a rotating cutter wheel driven by a gas or diesel engine. The cutter wheel, while rotating, is advanced toward the stump and moved laterally across the face of the stump. The cutter wheel is mounted at one end of a boom which is, in turn, pivotally mounted on a support frame. Hydraulic boom swing cylinders are used to pivot the boom about the pivot point to move the cutter wheel back and forth across the face of the stump to cut it away. The hydraulic boom swing cylinders are controlled by control lever handles. The handles also can provide an additional function, namely determining operator presence. For this latter function, the cutter wheel is stopped if the operator does not maintain his or her hand on the handle(s) during operation.

Figure 1:
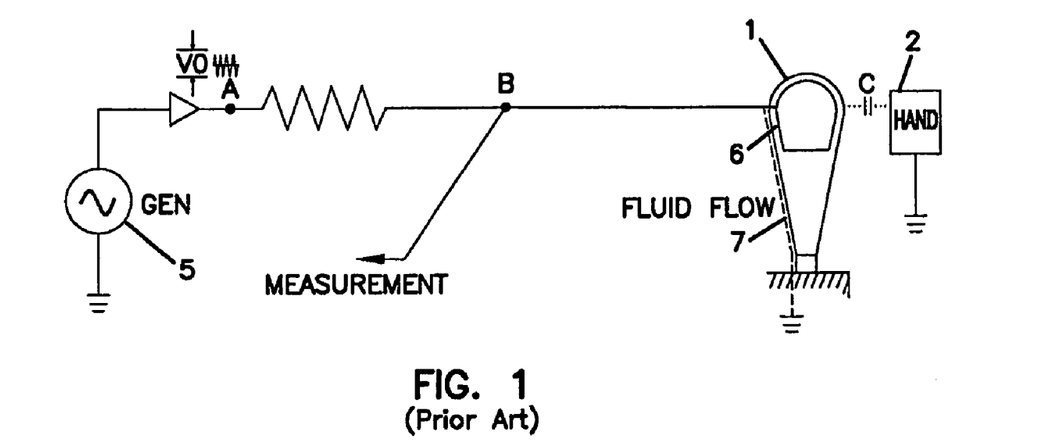
FIG. 1 is a schematic representation of a prior art capacitive sensor used with a stump cutter control lever and the detection circuit employed therewith.

Using trigger switches and other spring biased devices employed on the operator handles to detect operator presence creates difficulties for the operator which include, among other things, operator fatigue by requiring that the operator's hands remain in a fixed position to engage the biased device over long periods of time while manipulating the cutter wheel positioning controls numerous times using one or both hands. In order to relieve these difficulties, capacitive sensing on the handles has also been used. FIG. 1 illustrates this type of prior art system.

More specifically, the capacitive sensing devices in FIG. 1 include a ring sensor 6 mounted in the handle 1. When the operator's hand 2 touches the handle, the capacitance C is changed. A circuit includes a wave generator 5 to provide a signal to the ring sensor 6. The circuit senses the change in capacitance and interprets the change in capacitance as detecting operator presence. One drawback of this system, is that water 7 (such as from rain or snow) touching the handle may provide a change in the capacitance—even if the operator's hand is not on the handle. Because stump cutters are used in outdoor environments, the handles are exposed to the elements and so detection errors may occur.

Accordingly, there is a need in the art for a method and apparatus to more reliably determine if an operator's hand(s) is present on the control handle while the machine is in operation. The present invention overcomes the shortcomings of the prior art, and addresses these needs.

SUMMARY OF THE INVENTION

The preferred operator detection and presence device constructed in accordance with the principles of the present invention includes a conductive sensor and a guard electrode. The sensor and electrode are physically located and electrically connected in a manner which helps the detection circuit measure if an operator's hand is on the handle or if the change in capacitance is due to water. While the device is particularly useful for determining operator presence in connection with a stump cutter, the principles could be applied to other cutting, grinding, and chipping equipment, with a stump cutter being one example only.

The sensor and electrode are preferably physically located in the handle spaced apart from one another, where the sensor is located in an area that the operator will touch. The electrode is located in an area that the operator will not generally touch. A detection circuit is connected to the sensor and electrode for measuring whether the capacitance of the sensor has changed. In the preferred embodiment, the sensor is used to determine if the operator is touching the handle. The electrode is used to avoid false detections and/or the ability to detect of operator presence. The output from the detection circuit is preferably provided to a mechanical or electrical controller for the stump cutter, which controller inhibits operation of the stump cutter if operator presence is undetected.

In the present application, the presence of an operator is described as being determined by sensing if the operator is touching the handles. As used herein, the term "touching" and/or "contact" is intended to describe contact between the handle and a bare hand, a gloved hand, and/or some other part of the operator body (uncovered or clothed). Accordingly, the terms touching and contacting are meant to include direct contact of the handle by the operator, as well as indirect contact of the handle through gloves, clothes, and other work related coverings.

One feature of the present invention is that use of capacitive sensing is maintained to avoid operator fatigue while minimizing detection errors due to water, sweat, and/or other conductive liquids.

Another feature of the present invention is that shielded wire (e.g., coaxial cable) is used between the detector circuit and the sensor and electrode in the control handles. This allows the system sensitivity to be set to reliably detect an operator's hands with gloves while minimizing the likelihood of unintended activation.

Therefore, according to one aspect of the invention, there is provided a capacitive operator presence detector for an operator control handle, comprising: a capacitive sensor mounted in the handle, the capacitive sensor arranged and configured to form a capacitor when the handle is touched by an operator; a guard electrode mounted in the handle, the guard electrode arranged and configured to substantially isolate the capacitive sensor from ground when it is not touched by an operator; and an operator presence circuit connected to the capacitive sensor and the guard electrode, the circuit having a node where changes in capacitance of the capacitive sensor can be measured as a change in voltage and where the change in voltage is provided to the guard electrode, whereby the voltage at the guard electrode is equal to the voltage at the capacitive sensor and any changes in capacitance due to water on the handle forming capacitance to ground are reduced.

According to another aspect of the invention, there is provided a method of detecting the presence of an operator touching a hydraulic control handle of a stump cutter, comprising: generating an electrical signal; connecting a capacitive sensor mounted in the handle to the electrical signal, the capacitive sensor forming a capacitor when the handle is touched by an operator; connecting a guard electrode mounted in the handle to the electrical signal, the guard electrode substantially isolating the capacitive sensor from ground when it is not touched by an operator; and connecting the capacitive sensor and the guard electrode to a detection circuit, the detection circuit having a node where changes in capacitance of the capacitive sensor can be measured as a change in voltage and where the change in voltage is provided to the guard electrode, whereby the voltage at the guard electrode is equal to the voltage at the capacitive sensor and any changes in capacitance due to water on the handle forming capacitance to ground are reduced.

While the invention will be described with respect to preferred embodiment configurations and with respect to particular devices used therein, it will be understood that the invention is not to be construed as limited in any manner by either such configuration or components described herein. While the example of a stump cutter type device is provided herein, the principles of this invention extend to any environment in which operator presence and/or detection is desired. These and other variations of the invention will become apparent to those skilled in the art upon a more detailed description of the invention.

The advantages and features which characterize the invention are pointed out with particularity in the claims annexed hereto and forming a part hereof. For a better understanding of the invention, however, reference should be had to the drawings which form a part hereof and to the accompanying descriptive matter, in which there is illustrated and described a preferred embodiment of the invention.

BRIEF DESCRIPTION OF THE DRAWINGS

Referring to the drawings, wherein like numerals represent like parts throughout the several views.

DETAILED DESCRIPTION OF THE PREFERRED EMBODIMENT

The principles of the present invention apply particularly well to its application in a stump cutter device environment. However, other environments in which operator presence and/or detection is desired may also employ the principles of this invention. For example, the present invention may be employed in tree, grass, brush and stump devices that cut, chip and/or grind.

As noted above, sensors within the handles 21, 50, 51 (described below) are used for determining operator presence by detecting whether the operator is touching at least one of three handles so as to allow a cutting wheel or grinding disk clutch to remain engaged. Loss of operator contact with the handles triggers the clutch to disengage after a predetermined period of time. A brake then preferably halts grinding disk rotation (the terms cutting wheel and grinding disk are both used herein to describe the powered element of the stump cutter).

Figure 2:
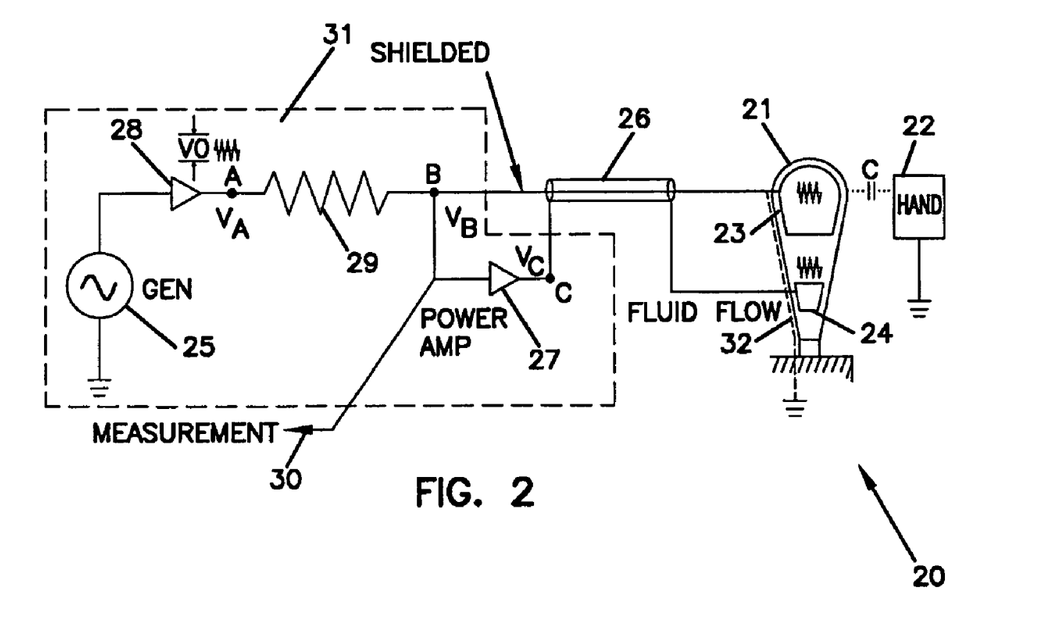
FIG. 2 is a schematic representation of a control lever for a stump cutter including a capacitive sensor and guard electrode connected with the detection circuit employed therewith.

Turning now to the operator detector/presence system of the present invention, reference will be had to FIG. 2. The system is shown generally at 20 and is comprised of capacitive sensor 23 and guard electrode 24, as well as connecting cable 26 and detection circuit 31. The sensor 23 and electrode 24 are located within handle 21.

Figure 3:
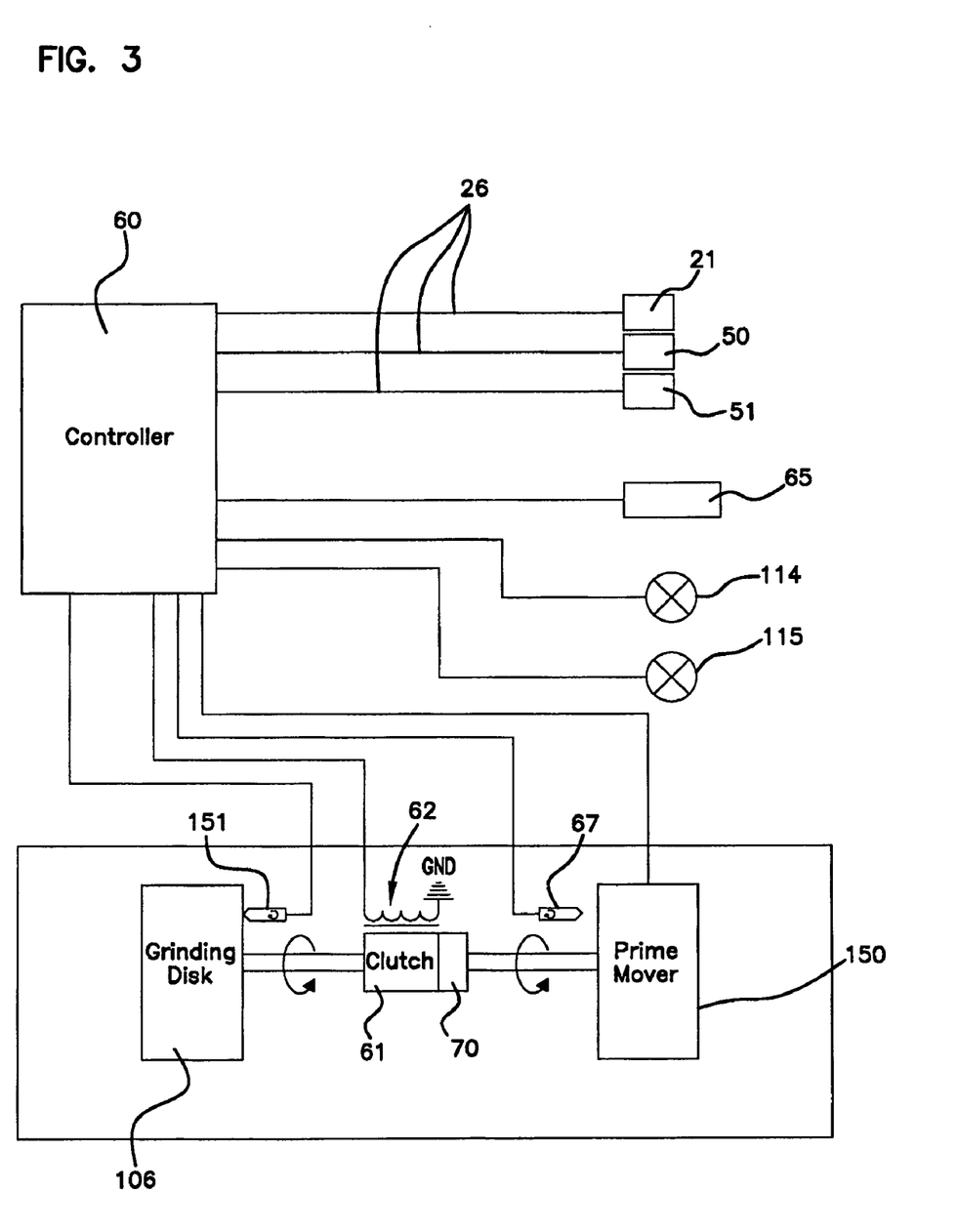
FIG. 3 is a schematic representation of the operator presence controller connections showing the handles and circuitry utilized with the controller.

In the preferred embodiment stump cutter, there are three hydraulic control handles 21, 50, and 51 (best seen in FIG. 3). For clarity, however, only one handle is illustrated in FIG. 2. Preferably, the second and third handles 50, 51 are constructed in an identical fashion as the first handle 21. Further, the detection circuits associated with the second and third handles 50, 51 may be equivalent to detection circuit 31 (described below).

In the case of other embodiments used in connection with other types of equipment, it may be possible to utilize a single handle 21 as described herein—either alone or in combination with operator presence or detection devices. Accordingly, the invention is not limited to use of a plurality of identical handles in connection with a single machine.

Still referring to FIG. 2, the capacitive sensor 23 is preferably a discrete ring physically located in the hydraulic valve control lever handle 21. In operation, the sensor is able to detect changes in capacitance when a hand or other object touches the handle 21. A hand touching the handle 21 is schematically shown at block 22. The hand 22 forms a capacitor C (i.e., the capacitive sensor acts as a first plate of the capacitor, with the hand to ground forming the other plate). The detection circuit 31 senses the change in capacitance caused by human touch. The measurement output 30 of the detection circuit 31 is provided to the logic of a controller unit 60. The controller unit 60 preferably utilizes the handles 21, 50, 51 as part of a greater control system. More specifically, the sensing system is based on a change in capacitance that is observed by the circuit 31 when a human hand 22 is very close to or touching the handle 21.

By using the guard electrode 24, the operator presence system becomes less sensitive to the effects of rain or other conductive liquid including humid air or moisture on or in close proximity with the handle 21. Detection circuit 31 includes a low radio frequency sine wave generator 25. The amplitude and phase of the sinusoidal wave at the capacitive sensor 23 is affected by objects 22 in the proximity of the upper portion of the handle 21 (e.g., when said objects form a capacitor C). The amplitude and phase of the voltage at point $V_B$ is also provided via power amplifier 27 to node C as voltage $V_C$. This causes the voltage at the guard electrode 24 to be at the same voltage as the capacitive sensor 23. By lifting the voltage on a lower point of the handle above ground, the effects of water on the handle 21 are eliminated. Accordingly, water present or flowing on the handle 21 does not ground the capacitive sensor 23 and/or act to form a capacitor.

The voltage measured ($V_B$) at node B is the output measurement 30. It is an inverse function of the capacitance between the capacitive sensor 23 being measured and the other objects within the electric field acting as plates. In the preferred embodiment, an IC chip manufactured by Freescale Semiconductor, Inc. of Austin, Tex., is used in the detection circuit 31. The chip includes a series resistor 29 chosen such that a linear relationship between voltage and capacitance exists for capacitance values of 10 pF to 70 pF.

Design of the capacitive sensor 23 within the handle 21 includes consideration of the following capacitor properties:

Capacitance is proportional to the area of the "plates". This corresponds to contact area on the handle 21.

Capacitance is proportional to the dielectric constant of the material separating the "plates". Capacitance is therefore dependent on ambient air properties such as humidity.

Capacitance is inversely proportional to the distance between the "plates". This property affects sensitivity settings especially based on the thickness of any overmolding 103 (best seen in FIG. 4a) on the handle 21.

The following Table 1 illustrates approximate measured voltages and capacitances of the embodiment of FIG. 2.

TABLE 1

|  | $V_A$ | $V_B$ | C |
| --- | --- | --- | --- |
| No Hand | $V_0$ | $V_0$ | ~10-20 pF = $C_0$ |
| Hand (22) | $V_0$ | $V_1 < V_0$ | ~25-50 pF (gloved) ~50-70 pF (bare) |
| Water, One sensor | $V_0$ | $V_2 \neq V_1$ | ~30-40 pF |
| Water, Both sensors | $V_0$ | $\approx V_0$ | ~$C_0$ + 1 pF |

In FIG. 1, if water 7 is present on the handle 1 having a single ring, then the liquid forms a second electrode of the capacitor causing the capacitance to change—similar to a gloved hand touching the handle 1. The present system, however, effectively breaks this conductive path through the fluid and isolates the capacitive sensor from the ground. Also, for the present system to operate in its intended manner, it is preferably that the capacitance change caused by water is smaller than the capacitance change caused by a hand.

The upper or capacitive sensor 23 is positioned on the upper portion and on top of the handle 21 to allow for operator hand placement preferences. This sensor 23 is separated from the lower or guard electrode 24. The guard electrode 24 is located at the base of the handle 21 where an operator will not generally touch it. Since the sensor 23 and electrode 24 have equal voltage magnitudes and are in-phase, a capacitor formed by conductive liquid between the two would not carry any current and they would remain separate. Fluid could cause increased capacitance between the guard electrode 24 to ground, however, the power amplifier 27 isolates point C from point B ($V_B = V_C$) since it has a high input impedance/low output impedance. Therefore, the measurement taken by the controller 60 would use the voltage from the capacitive sensor 23 ($V_B$) which is the electrode or sensor of concern in detecting operator presence. The guard electrode 24 helps establish whether the change in capacitance of the first electrode is due to an operator or fluid on the handle.

Referring again to Table 1, it may be noted that the sensitivity can be set to a cutoff of 50 pF such that the capacitance due to flowing water would not be understood as operator presence. However, this may limit the operator to using bare hands. In practice it may be desirable to be able to detect an operator wearing gloves (even as thick as winter gloves). Further, many operators may desire to only lightly touch the top of the handle to indicate their presence rather than to grip the handle fully. The corresponding relatively small contact area inherent to this practice may produce a capacitance of only 45 pF with bare hands in which case the system would not recognize operator presence. Since the capacitance due to water so closely approximates that of a human presence, it is desirable to use the present system to eliminate sensitivity to such effects.

Calibration on power-up of the controller 60 allows the system to establish a baseline capacitance based on environmental conditions. This allows the capacitance effects of elements such as rain and humidity to be discounted for the duration of machine operation. The capacitance seen by the system on power-up becomes the baseline and an increase in capacitance due to the user contacting the handles is required to trip the sensor system. The controller 60 remembers the baseline capacitance seen at power-up and subtracts that value from values seen during operation before applying sensitivity parameters. For example, if the controller 60 records a capacitance of 10 pF on power-up and later observes a capacitance of 50 pF, then the system will act as if no operator is present if the sensitivity cutoff point is set at 45 pF, but will act as if an operator is present if the sensitivity cutoff point is set at 35 pF.

In the preferred embodiment, if an operator's hand 22 is touching the handle 21 at power-up of the controller 60, then the baseline for that handle is out of range. In this case, that handle is ignored and operator presence is determined with the other handles. In this manner, the present system 20 is able to avoid false detections and to detect operator presence when the initial calibration would otherwise place the result out of range.

The baseline capacitance may include the capacitance created by any grounded objects in reasonable proximity—including the ground itself—as well as the wiring 26. The sensitivity cutoff point can be pre-selected and programmed into a controller unit based on testing related to the specific application for the handle(s).

Figure 4A:
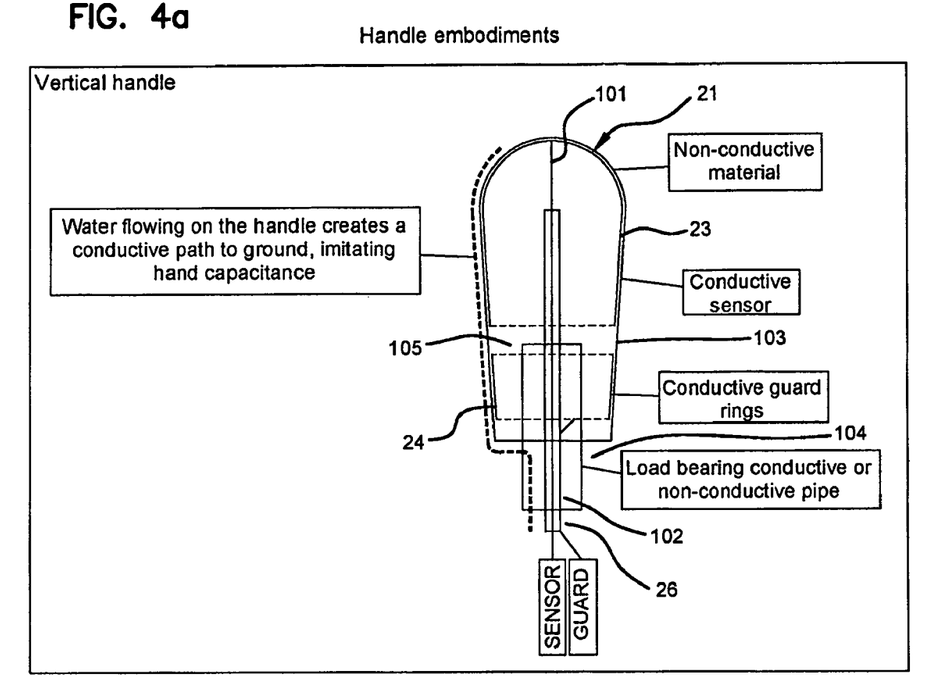
FIG. 4a shows the arrangement of the various components included in handle 21.

The present invention preferably includes a handle 21, 50, 51 design which completely and permanently encloses the capacitive sensor 23 and guard electrode 24 within a molding 103 (best seen in FIG. 4a). The necessary wiring 26 exits the bottom of the handle 21 and is sent to the controller 60 via a plug which allows for simplicity of replacement if a handle is damaged. Ideally, the handle wires 26 are completely shielded from the possibility of being damaged along their length.

FIG. 3 illustrates the three handles 21, 50, and 51 (each having the internal sensor and electrode, not specifically shown in this figure) connected to the stump cutter controller 60. A connection board, plug or strip (not shown) may be used to provide modular connectivity. The outputs include connections to the clutch relay 62, clutch light 114, and clutch switch 65. As noted above, when an operator is no longer sensed, the controller de-energizes the clutch relay 62. This in turn opens the clutch 61 so that the cutter wheel 106 is not turned by the motor 150 (generally a prime mover). Additionally, a brake may be engaged to stop the cutter wheel. Clutch light 114 may provide visual indication to an operator on the status of the clutch 61. Those skilled in the art will appreciate that additional diagnostic display capability may also be provided. For example diagnostics light 115 may be provided. Also, pickup sensors 151 and 67 may be used to provide speed indications to the controller 60 for the grinding disk 106 and motor 150, respectively.

Figure 5:
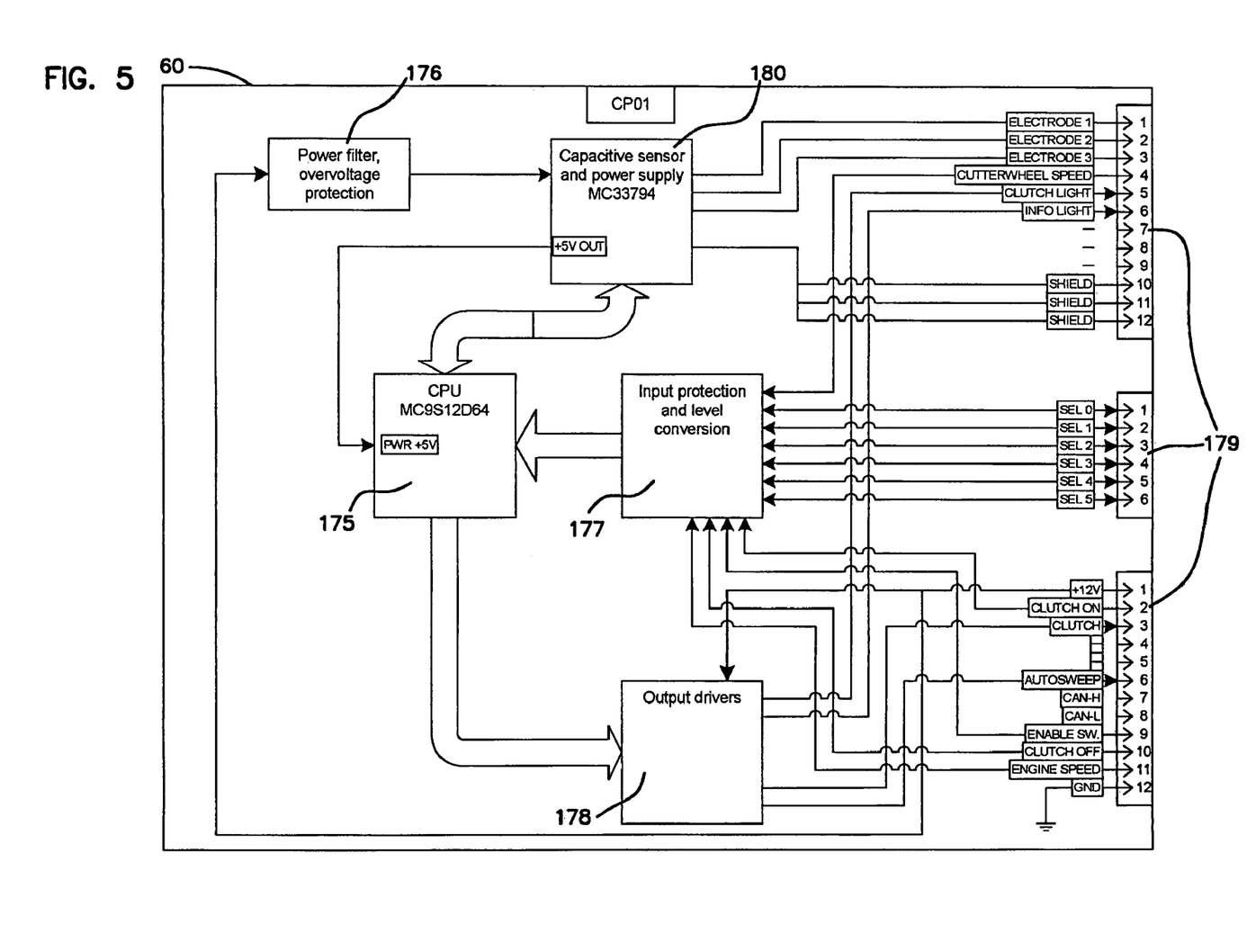
FIG. 5 functionally illustrates the controller 60.

FIG. 5 schematically illustrates the functional components that comprise the preferred controller 60. Block 176 provides power filtering and overvoltage protection to the various components. Block 175 provides the central processor and on-board memory to store programming steps. Block 177 provides input protection and conversion for the various inputs. Block 178 provides output drivers for the various outputs.

Blocks 179 illustrate the various input and output connections of the controller 60. Block 180 includes the preferred capacitive sensor circuit 31 and power supply.

FIG. 4a illustrates in closer detail the physical spacing of the capacitive sensor 23 and guard electrode 24. An overcoating 103 covers handle 21 to protect it from the environment. A supporting or load-bearing shaft 104 is provided to connect the handle 21 to the machine. In the preferred embodiment, the shaft 104 is constructed of aluminum. However, other materials may be used which provide the necessary structure and rigidity. Since the preferred shaft 104 is conductive and may impact the measured capacitance of sensor 23 if placed in close proximity, it will be appreciated that the shaft 104 does not extend all the way up to the capacitive sensor 23. A plastic, non-conductive element 105 is mounted on the shaft 104 and holds the sensor 23 and electrode 24 in place. The wiring 26 providing electrical transmission from the sine wave generator 25 includes a sensor signal flow path 101 and a guard signal flow path 102. The sensor signal flow path 101 is operatively connected to the plate of the sensor 23. The guard signal flow path 102 is operatively connected to the guard electrode 24.

ALTERNATIVE EMBODIMENT

Figure 4B:
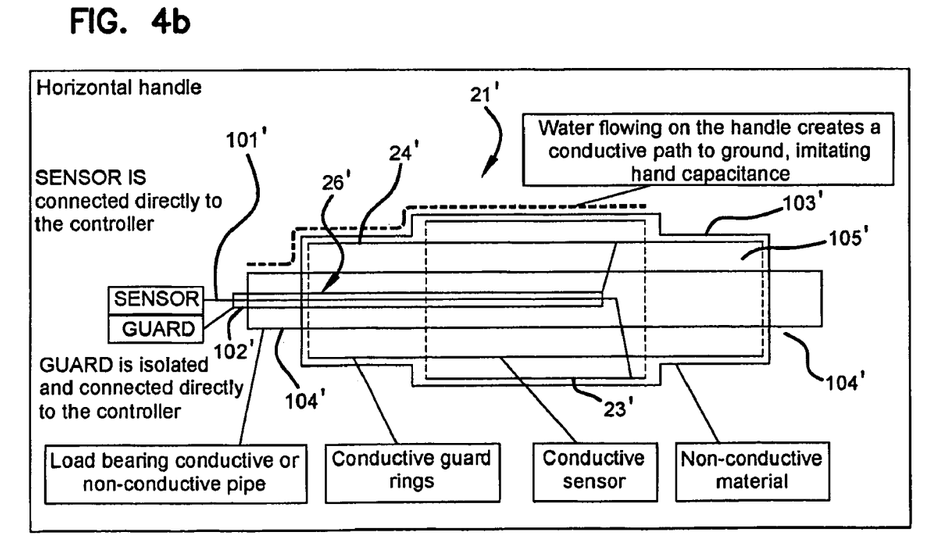
FIG. 4b shows an alternative embodiment of the capacitive sensor and guard electrode used in connection with a horizontally oriented handle.

Turning now to FIG. 4b, an alternative embodiment of the present invention is illustrated. Here, the handle orientation is horizontal rather than vertical. By way of example, this type of handle may be used in connection with a lawn mower where a horizontal handle is gripped during operation. This gripping could be sensed with a similar system to that of the present invention. The designations associated with the vertical embodiment illustrated in FIG. 4a are used in FIG. 4b with a prime to illustrate similar parts.

The physical location and spacing of the sensor 23' and electrode 24' are illustrated as well as the respective capacitive plate areas. An overcoating 103' covers handle 21' to protect it from the environment. A supporting or load-bearing shaft 104' is provided to connect the handle 21' to the equipment. A plastic element 105' is attached to the shaft and holds the sensor 23' and electrode 24' in position. The wiring 26' providing electrical transmission from the sine wave generator 25 includes a sensor signal flow path 101' and a guard signal flow path 102'. The sensor signal flow path 101' is operatively connected to the plate of the sensor 23'. The guard signal flow path 102' is operatively connected to the electrode 24'. The handle 21' has a longitudinal axis where the sensor 23' is located in a first portion of the handle, and guard electrode is physically located inside of the first sensor and in a second portion of the handle (where at least a part of the second portion is offset from the first portion in the direction of the connection between the shaft 104' and the equipment).

This alternative arrangement provides a capacitive sensing system that makes the system insensitive to moisture/rain. In the horizontal embodiment, the gripping which may be very common for operators in applications such as that of a lawn mower would cause greater capacitance due to a greater surface area. Accordingly, the sensitivity of the sensors may be adjusted accordingly.

It should be understood that even though numerous characteristics and advantages of the present invention have been set forth in the foregoing description, together with details of the structure and function of the invention, the disclosure is illustrative only and changes may be made in detail, especially in matters of the supporting hardware, components and devices, and to the full extent indicated by the broad general meaning of the terms in which the appended claims are expressed.

We claim:

1. A capacitive operator presence detector for an operator control handle, comprising:
   (a) a capacitive sensor having a ring shaped portion with an end, mounted in the handle at a first upper position along a longitudinal axis of the handle, and extending proximate a surface of the handle, the capacitive sensor arranged and configured to form a capacitor when the handle is touched by an operator;
   (b) a guard electrode separate from the capacitive sensor, having a ring shaped portion with an end, and extending proximate a surface of the handle, the guard electrode mounted in the handle at a second lower position along the longitudinal axis of the handle, the end of the guard electrode being adjacent the end of the capacitive sensor wherein the guard electrode is offset from the capacitive sensor along the longitudinal axis of the handle, the guard electrode arranged and configured to substantially isolate the capacitive sensor from ground when it is not touched by an operator; and
   (c) an operator presence circuit connected to the capacitive sensor and the guard electrode, the circuit having a node where a change in capacitance of the capacitive sensor is measured as a change in voltage and where the change in voltage is provided to the guard electrode, wherein the voltage at the guard electrode is equal to the voltage at the capacitive sensor and changes in capacitance due to water on the handle forming capacitance to ground are reduced.

2. The capacitive operator presence detector of claim 1, wherein the capacitive sensor is located on a top portion of the handle.

3. The capacitive operator presence detector of claim 2, wherein the guard electrode is located on a lower portion of the handle.

4. The capacitive operator presence detector of claim 1, wherein the handle is covered by a protective coating.

5. The capacitive operator presence detector of claim 1, wherein the capacitive sensor and the guard electrode are connected to a frequency generator.

6. The capacitive operator presence detector of claim 1, wherein an initial voltage is read and stored to provide a baseline capacitance and a predetermined sensitivity cutoff is established for determining whether a measured voltage is interpreted as operator presence.

7. The capacitive operator presence detector of claim 1, wherein a shielded wire is used to connect the capacitive sensor and the guard electrode to the operator presence circuit.

8. The capacitive operator presence detector of claim 1, wherein the detector is located on a stump cutter.

9. A method of detecting the presence of an operator touching a hydraulic control handle of a stump cutter, comprising:
   (a) generating an electrical signal;
   (b) connecting a capacitive sensor to the electrical signal, the capacitive sensor mounted in the handle at a first position along a longitudinal axis of the handle and forming a capacitor when the handle is touched by an operator;
   (c) connecting a guard electrode to the electrical signal, the guard electrode separate from the capacitive sensor and mounted in the handle at a second position along the longitudinal axis adjacent and offset from the first position and substantially isolating the capacitive sensor from ground when it is not touched by an operator; and (d) connecting the capacitive sensor and the guard electrode to a detection circuit, the detection circuit having a node where a change in capacitance of the capacitive sensor is measured as a change in voltage and where the change in voltage is provided to the guard electrode, wherein the voltage at the guard electrode is equal to the voltage at the capacitive sensor and changes in capacitance due to water on the handle forming capacitance to ground are reduced.

10. The method of claim 9, wherein the electrical signal is a sine wave.

11. A capacitive operator presence detector for an operator control handle, comprising:

a capacitive sensor mounted in the handle, having a ring shaped portion, the exterior surface of the ring shaped portion extending proximate a surface of the handle, and wherein the capacitive sensor is arranged and configured to form a capacitor when the handle is touched by an operator;

a guard electrode mounted in the handle, the guard electrode including a first length positioned within the ring shaped portion of the capacitive sensor and at least a second length proportional to the first length positioned external to the capacitive sensor, wherein the guard electrode is arranged and configured to substantially isolate the capacitive sensor from ground when it is not touched by an operator; and an operator presence circuit connected to the capacitive sensor and the guard electrode, the circuit having a node where a change in capacitance of the capacitive sensor is measured as a change in voltage and where the change in voltage is provided to the guard electrode, whereby the voltage at the guard electrode is equal to voltage at the capacitive sensor and changes in capacitance due to water on the handle forming capacitance to ground are reduced.

* * * * *